United States Patent [19]
Nakata et al.

[11] Patent Number: 5,976,703
[45] Date of Patent: Nov. 2, 1999

[54] MATERIAL AND METHOD FOR PLANARIZATION OF SUBSTRATE

[75] Inventors: Yoshihiro Nakata; Shyun-ichi Fukuyama; Michiko Katayama; Joe Yamaguchi; Hideki Harada; Yoshiyuki Ohkura, all of Kawasaki, Japan

[73] Assignee: Fujitsu Limited, Kanagawa, Japan

[21] Appl. No.: 08/662,233

[22] Filed: Jun. 14, 1996

[30] Foreign Application Priority Data

Aug. 17, 1995 [JP] Japan ..................... 7-209709

[51] Int. Cl.⁶ ..................... B32B 9/04
[52] U.S. Cl. ............ 428/447; 428/450; 428/901; 528/33; 528/43
[58] Field of Search ............ 528/33, 43; 428/447, 428/450, 901

[56] References Cited

U.S. PATENT DOCUMENTS

| | | | |
|---|---|---|---|
| 2,445,794 | 7/1948 | Marsden | 528/32 |
| 4,172,169 | 10/1979 | Mawson et al. | 428/159 |
| 4,233,427 | 11/1980 | Bargain et al. | 528/35 |
| 4,331,733 | 5/1982 | Evans et al. | 428/379 |
| 4,778,871 | 10/1988 | Newhouse et al. | 528/35 |
| 5,035,927 | 7/1991 | Chen et al. | 427/444 |
| 5,240,813 | 8/1993 | Watanabe et al. | 528/35 |
| 5,484,687 | 1/1996 | Watanabe et al. | 430/296 |

*Primary Examiner*—Randy Gulakowski
*Attorney, Agent, or Firm*—Armstrong, Westerman, Hattori, McLeland & Naughton

[57] ABSTRACT

A material and a method for planarizing an uneven surface of a substrate, such as those used for making wiring boards and electronic devices and having broad patterns on their surfaces, are provided. The material is a polysilphenylenesiloxane or a copolymer of polysilphenylenesiloxane with an organosiloxane, and is applied to an uneven surface of a substrate, and then heated to be reflowed to thereby be formed into a planarized film or layer. The material allows a substrate containing wiring having a width of up to several hundred micrometers to be planarized.

14 Claims, 8 Drawing Sheets

T: GLOBAL LEVEL DIFFERENCE
L: WIDTH OF WIRING

MATERIAL AND METHOD FOR PLANARIZATION OF SUBSTRATE

BACKGROUND OF THE INVENTION

1. Field of the Invention

The invention relates to a material for planarizing an uneven or up-and-down surface of a substrate, such as those used for making wiring boards and electronic devices, and a method for planarizing a surface of a substrate using the material of the invention. The invention can planarize a substrate surface carrying wirings having a width as wide as several hundred micrometers, and is particularly useful in forming multi-layered wirings having less than half micrometer rule wiring patters. The invention also relates to a substrate having a surface planarized by the material and method of the invention.

2. Description of the Related Art

In recent years, as the degree of integration in semiconductor integrated circuits has increased and the density of semiconductor device elements has increased, the demand has increased for the multi-layering of semiconductor device wirings. Also, thicker wirings are needed to prevent reduction in wiring capacity due to minute wirings, which leads to a tendency to increase in a level difference between an upper and lower surfaces of a film or layer formed so as to cover the and a support on which the wiring are located, the upper surface corresponding to the surface of the film or layer present on the wiring, and the lower surface corresponding to the surface of the film or layer present on the area of the support in which the wirings are absent. Thus, in order to form minute wirings, particularly multi-layered wirings, it is required to form an interlayer insulating film providing excellent planarizability which can extend a focus margin of a resist.

For such a requirement, planarization of a substrate has been carried out by applying a spin-on-glass (SOG) on the substrate by a spin coating to thereby fill in spaces between adjacent ridges. In this technique, a width of wiring capable of being planarized is limited to at most nearly 5 micrometers, which is in the range of the width of a local eminence, even in relatively good cases, and it is impossible to planarize a substrate surface having wider wirings.

On the other hand, for a method of planarizing topographic substrate having a width of several score micrometers or more wiring patterns, which is in the range of width of a global eminence, chemical-mechanical polishing (CMP), in which mechanical polishing is performed while using an etching solution, has been studied. However, this method may damage wiring, and has the inconveniences of, for example, low throughput, because the CMP requires an alkaline solution, such as a KOH solution, as the etching solution, and a low polishing rate to provide sufficient flat properties for wide wirings.

In contrast, a technique is used in which a planarizing material which reflows on heating is applied on an insulating film thickly formed on wirings by a process such as a chemical vapor deposition (CVD), to thereby form a planarized film, and thereafter, the planarized film and portions of the underlying insulating film are removed by an etchback process, to thereby planarize the insulating film. In this technique, wiring patterns having a width of at most several score of micrometers can be only planarized, because the reflowability of the planarizing material is insufficient.

As used herein, the term "eminence" means a projection or convexity present on a surface of a substrate, regardless of its sizes such as height, width, length, and diameter, which is responsible for unevenness of the surface of the substrate. Further as used herein, "local eminence" means an eminence at a surface of substrate, which results from formation of an uneven or up-and-down pattern on a support, such as a wiring pattern, having a width as narrow as of at most about 10 micrometers. Also as used herein, "global eminence" means an eminence at a surface of substrate, which results from formation of an uneven or up-and-down pattern on a support, such as a wiring pattern, having a width reaching several hundred micrometers or more. As used herein, "support" means a support or base on which an uneven or up-and-down pattern or layer is formed by conventional processes such as those used in the electronic industries, including resist pattern formation and subsequent etching. The term "substrate" is used to mean a substrate including the support and an uneven or up-and-down pattern or layer formed thereon and having eminences at its surface resulting from the formation of the pattern or layer. As described hereinafter, the present invention is applied to such a substrate. It should be noted that the term "substrate" is to be understood to include substrates having any uneven or rough surface, which exhibits a much smaller eminence than the eminence developed by the formation of wiring pattern. Thus, the "substrate" in the invention may include substrates having an unpolished surface, such as those made of a crystal. It should be also noted that the "substrate" also means a substrate comprising a support having eminences such as those resulting from formation of an uneven pattern and a film or layer made of a planarizing material or another material such as an insulating material.

Various siloxane polymers having silphenylene bonds in their molecules, such as the polymer used in the present invention, are known. For example, U.S. Pat. Nos. 2,445, 794, 4,778,871, and 5,035,927 describe siloxane polymers containing silphenylene bonds in their skeleton. Further, Japanese Examined Patent Publication No. 6-36099 (JP B 6-36099) (which corresponds to U.S. Pat. Nos. 5,240,813 and 5,484,687) discloses a polysilphenylene siloxane which is useful for a resist material. In addition, the following references also describe siloxane polymers having silphenylene bonds in their molecules: Y. Lai, P. R. Dvornic and R. W. Lenz, Journal of Polymer Science, Polymer Chemistry Edition, Vol. 20, 2277–2288 (1982); Y. Nagase, K. Ikeda, and Y. Sekine, Chem. Abs., 98 (16), 126994, Polymer, 23(11), 1646–52 (1982); M. Livingston, P. R. Dvornic and R. W. Lenz, Journal of Appl. Poly. Sci., 27, 3238–3251 (1982); and Noll, Chemistry and Technology of Silicones, pp. 139–140. However, no silphenylene siloxane polymer was hitherto known which allows to planarize a surface of a substrate on which the polymer is applied.

SUMMARY OF THE INVENTION

It is an object of the present invention to solve the problems raised by the prior art referred to above. In other words, an object of the invention is to provide a new material allowing eminences on a substrate, such as eminences of electrical source wirings in a multi-layered wiring board, which are classified as global eminences and have a width reaching several hundred micrometers, to be planarized.

It is another object of the invention to provide a method for planarizing global eminences on a surface of a substrate using the material of the invention.

It is still another object of the invention to provide a substrate having a planarizing layer which covers eminences in the layer underlying the planarizing layer, and which is formed by the material and method of the invention.

According to the invention, there is provided a material for planarizing an uneven or up-and-down surface of a substrate, the material consisting essentially of a polymer represented by the general formula:

(1)

wherein each of the substituents $R^1$ to $R^4$ is an alkyl group having 1 to 3 carbon atoms, alkylene group having 2 or 3 carbon atoms, or phenyl group, the substituents $R^1$ to $R^4$ being capable of denoting the same or different groups, and n is a positive integer, the polymer having a weight average molecular weight of 500 to 50,000, and the polymer exhibiting a sufficient reflowability to be planarized when coated on an uneven surface of a substrate and heated. As can be seen from the above general formula, the material of the invention is a linear siloxane-based polymer material containing silphenylene bonds in its molecular skeleton.

In another aspect of the invention, the material for planarizing an uneven or up-and-down surface of a substrate of the invention is a material consisting essentially of a polymer represented by the general formula:

(2)

wherein each of the substituents $R^1$ to $R^4$ is an alkyl group having 1 to 3 carbon atoms, alkylene group having 2 or 3 carbon atoms, or phenyl group, the substituents $R^1$ to $R^4$ being capable of denoting the same or different groups, each of the substituents $R^5$ and $R^6$ is an alkyl group having 1 to 3 carbon atoms, alkylene group having 2 or 3 carbon atoms, or phenyl group, the substituents $R^5$ and $R^6$ being capable of denoting the same or different groups, m and n are positive integers, and the ratio of m to n is less than 2, the polymer having a weight average molecular weight of 500 to 50,000, and the polymer exhibiting a sufficient reflowability to be planarized when coated on an uneven surface of a substrate and heated. As can be seen from the general formula, this material for planarizing an uneven or up-and-down surface of a substrate of the invention is a linear polymer material which is formed by copolymerization of the siloxane-based polymer represented by the above general formula (1) with an organosiloxane, and which also contains silphenylene bonds in its molecular skeleton.

The method for planarizing an uneven or up-and-down surface of a substrate of the invention comprises coating the uneven or up-and-down surface of the substrate with the material of the invention, and heating the coated substrate to thereby allow the material thereon to be reflowed to provide a planarized surface.

In another aspect, the method of the invention may comprise coating an uneven surface of insulating film formed on a substrate with the material of the invention, heating the coated substrate to thereby allow the material thereon to be reflowed to form a planarizing film, and removing the planarizing film and portions of the underlying insulating film by an etchback process to thereby planarize the insulating film.

As previously referred to, the term "substrate" is used to mean a substrate including a support or base and an uneven or up-and-down pattern formed thereon and having eminences at its surface resulting from the formation of the pattern. Thus, the substrates in the invention include substrates which have eminences or an uneven structure on its surface and are to be subjected to a process for planarizing the unevenness of the surface, such as those having eminences of wirings formed on a support, or those having a wiring layer and an insulating layer formed thereon. Such substrates may be exemplified by multi-layered wiring boards, representatives of which are print boards, and semiconductor devices having a multi layer structure. Also, it should be noted that the substrates in the invention may include any substrates having an unevenness of surface, such as those having an unpolished surface. Further, the term "substrate" does not exclude a substrate after treated by the material and method of the invention, which comprises a support having eminences, such as those resulting from formation of uneven pattern, and a film or layer made of a planarizing material or another material such as an insulating material.

BRIEF DESCRIPTION OF THE DRAWINGS

The above and other objects and advantages of the present invention will be well understood and appreciated by a person with ordinary skill in the art, from consideration of the following detailed description made by reference to the attached drawings, wherein.

DETAILED DESCRIPTION OF THE INVENTION

The planarizing material of the invention is the linear siloxane-based polymer containing silphenylene bonds in its molecular skeleton, or the linear polymer obtained by copolymerization of a siloxane-based polymer containing silphenylene bonds in its molecular skeleton with an organosiloxane, as described above.

It is preferred that these polymers have a weight average molecular weight of 500 to 50,000. In the case of a molecular weight of less than 500, the planarizing material evaporates or is thermally decomposed when it is coated onto a substrate and then heated to be reflowed, so that an aimed planarizing film cannot be formed. In the case of a molecular weight of above 50,000, the material has a higher melting point and accordingly poor reflowability, so that planarization of eminences having a broad width cannot be satisfactorily carried out. It is more preferred that the weight average molecular weight is in the range of 1,000 to 20,000.

When the polymer material of the invention is the linear siloxane-based polymer represented by the above general formula (1), each of the substituents $R^1$ to $R^4$ is an alkyl group having 1 to 3 carbon atoms, alkylene group having 2 or 3 carbon atoms, or phenyl group. The substituents $R^1$ to $R^4$ may be the same or different groups. If the substituents are alkyl and/or alkylene groups having 4 or more carbon atoms, the polymer material is not suitable for planarization of eminences having a broader width, because the polymer undergoes entanglement of molecules, has an increased melting temperature, and causes reduced reflowability. Representatives of the linear siloxane-based polymers of the formula (1) include polytetramethylsilphenylenesiloxanes, polytetraethylsilphenylenesiloxanes, and polytetravinylsilphenylenesiloxanes.

When the polymer material of the invention is the copolymer represented by the above general formula (2), the substituents $R^1$ to $R^4$ are as previously defined. Each of the substituents $R^5$ and $R^6$ is also an alkyl group having 1 to 3 carbon atoms, alkylene group having 2 or 3 carbon atoms, or phenyl group. The substituents $R^5$ and $R^6$ may also be the same or different groups. The limitation of the number of carbon atoms in alkyl and alkenyl substituents $R^5$ and $R^6$ is on the same grounds as of limitation for the substituents $R^1$ to $R^4$. In this copolymer, the ratio of m to n in the formula (2) is less than 2. If the ratio of m to n is equal to or greater than 2, it is impossible to planarize eminences having a broad width, such as a width reaching several hundred micrometers, because the polymer undergoes entanglement of molecules, and causes reduced reflow characteristics. Representatives of the copolymers having the general formula (2) include polytetramethylsilphenylenesiloxane/divinylsiloxane copolymers, polytetramethylsilphenylenesiloxane/dimethylsiloxane copolymers, and polytetramethylsilphenylenesiloxane/diallylsiloxane copolymers.

The polymer of the invention can readily manufactured from an appropriate starting substance or substances, using a conventional technique of organic synthesis. Accordingly, it is not necessary to describe a detailed method of the production thereof herein. Some of typical examples of syntheses of the polymers will be illustrated in the below Examples.

These polymers having silphenylene bonds are characterized by possessing a high crystalizability and exhibiting a very low viscosity on melting. Accordingly, the polymers show good reflowabilities after coated on a substrate, and allow global eminences, such as those having a width reaching several hundred micrometers, to be easily planarized.

When a polymer material having a high crystalizability is reflowed to make a film and then allowed to cool, the material is recrystallized to thereby produce minute unevenness on the surface of the film, so that the role of the material as a planarizing film is decreased. To avoid this, it is preferable in the invention to employ an alkenyl group or groups for at least some of the substituents in the above general formulae. Polymer materials containing an alkenyl group or groups can be crosslinked when melted at 200 to 300° C. for melting the material, so that these materials can be prevented from recrystallization even when cooled to ordinary temperatures. Further, even if the polymer of the planarizing material of the invention does not contain an alkenyl group but contains only alkyl groups, the polymer is capable of being crosslinked by irradiation with ionizing radiation having a high energy, such as ultra violet (UV) radiation or an electron beam, to thereby prevent recrystallization on cooling.

Films formed by thermosetting polymers generally have a low glass transition temperature (Tg), whereas films produced by UV-curing polymers exhibit a higher glass transition temperature. Although the planarizing films in the present invention may not free of such a common behavior, they generally have a relatively high thermal decomposition temperature of up to about 500° C. Accordingly, use of the material of the invention should be avoided for applications which require extremely high glass transition temperatures. In general, it is preferable to use the planarizing films formed of the material of the invention at a temperature of 350° C. or less. If the planarizing films are assumed to be used at a temperature higher than this temperature, the film may be removed by an appropriate process, such as an etchback process, accompanied by partial removal and planarization of the layer underlying the planarizing polymer film. Such a process will be specifically referred to below.

There are known prior art polysiloxanes containing silphenylene bonds in their molecules, which resemble the material of the invention also containing silphenylene bonds in its molecule. For example, JP B 6-36099 as referred to above, which corresponds to U.S. Pat. Nos. 5,240,813 and 5,484,687, discloses such a prior art polysilphenylenesiloxane. However, the polymer material of JP B 6-36099 is used as a resist material, and incorporates silphenylene bonds in its molecular structure in order to control swelling of the material during development operation using an organic solvent. Namely, the polymer material of JP B 6-36099 takes a structure in which silicon atoms forming the silphenylene structure (i.e., silicon atoms bonded to a benzene ring) are crosslinked through oxygen atoms; in other word, a three-dimensional ball-like structure consisting of nuclei of silphenylenesiloxane and triorganosilyl groups surrounding the silphenylene siloxane nuclei, to thereby realize resistance to swelling due to an organic developing solution. In contrast, the polymer material of the present invention is directed to planarization of substrate surface through reflow of the polymer material on heating, so that the polymer material of the invention keeps away from such as a three-dimensional ball-like structure of the polymer material disclosed in JP B 6-36099, and takes a linear structure. In this respect, the planarizing polymer material of the invention differs from the prior polymeric resist material having silphenylene bonds. Further, the planarizing material of the invention can be crosslinked by heating at the time of reflowing, to thereby create carbon-carbon (C—C) bonds, whereas the material of JP B 6-36099 already has the three-dimensional ball-like structure when coated as a resist material onto a substrate, and yet the crosslinking bond is a carbon-oxygen-carbon (C—O—C) bond.

Thus, up to now, no polymer material was known in the art, which allowed eminences on a substrate to be planarized by application onto the substrate and subsequent heating and reflowing. This is achieved by the unique features of the material of the invention that the material of the invention exhibits a sufficient low viscosity on heating to allow the material to be reflowed over an uneven surface of a substrate and provide a planarized surface on the substrate, which the inventors have unexpectedly discovered. It is further surprising that the reflowability of the material of the invention allows a surface containing eminences as broad as up to several hundred micrometers to be successfully planarized.

The method of planarizing an uneven surface of a substrate of the invention comprises coating the uneven surface of the substrate with the material of the invention, and heating the coated substrate to thereby allow the material thereon to be reflowed to planarize the surface of the substrate. In general, the planarizing material can be applied as a solution of the material in an appropriate organic solvent, to the substrate. Any solvent may be used, as long as it does not react with the planarizing material used, and can be easily evaporated after coating. Representative examples of the solvents include xylene, methyl isobutyl ketone, toluene and the like. It is preferred that the planarizing material dissolved in a solvent is coated by a spin coating process.

Conditions of heating for reflowing the planarizing material may be discretionally selected, taking into account a type of the material used, a type of the organic solvent, thermal resistance of the substrate to be treated, and the like. In general, however, heating at a temperature of 200 to 350° C. for 3 to 10 minutes may be adequate.

Figure 1A:
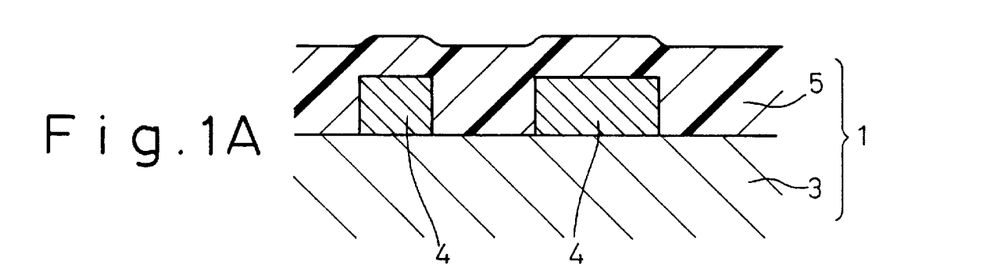
FIGS. 1A and 1B schematically show embodiments of the substrate of the invention.
Figure 1B:
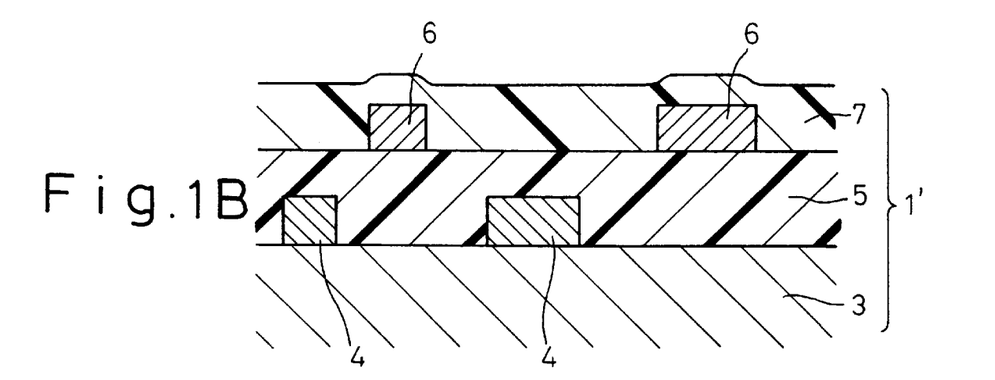

Thus, the substrate of the invention has a planarizing layer which covers eminences in the layer underlying the planarizing layer, and which is formed by the material and method of the invention. An embodiment of the substrate of the invention is schematically shown in FIG. 1A. In this drawing, the substrate of the invention is indicated by 1. The substrate 1 includes a support 3, eminences 4, such as wirings formed on the support 3, and a planarizing film 5. Because of good reflowability of the material of the invention as described above, the planarizing film 5 can provide a more even or smoother surface than a surface planarized by a prior polymer material, even if the eminences 4 have a width as broad as up to several hundred micrometers or more. Further, in another aspect of the invention, the substrate of the invention can advantageously comprise two or more planarizing films or layers. Such a substrate is schematically illustrated in FIG. 1B. The illustrated substrate 1' includes a support 3, eminences 4, and a planarizing film or layer 5 similar to those depicted in FIG. 1A, and comprises further eminences 6 formed on the planarizing film 5, and a second planarizing film or layer 7 covering the eminences 6.

In the method of the present invention, an insulating film unevenly formed on a support may also be planarized by coating the uneven surface of the insulating film with the material of the invention, heating the coated substrate to thereby allow the material thereon to be reflowed to form a planarizing film, and removing the planarizing film and portions of the underlying insulating film by an etchback process. Again, in this case, the coating and the reflowing of the planarizing material by heating can be carried out as described above. Although the technique itself of planarization of insulating films by an etchback process is already known, it will be briefly illustrated below.

Figure 2A:
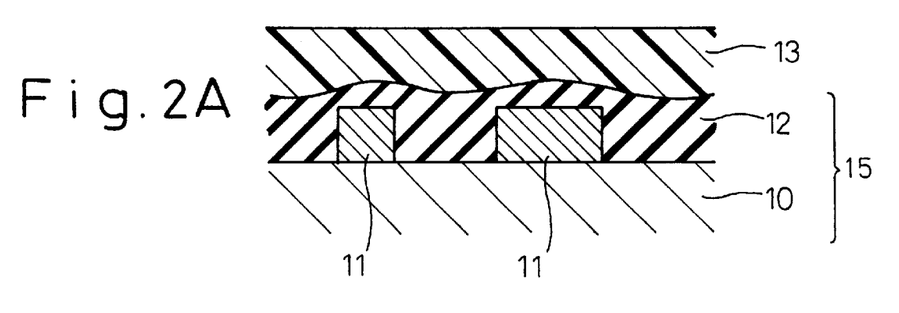
FIGS. 2A and 2B illustrate the method of the invention using an etchback process, the latter drawing further showing the resultant substrate of the invention.
Figure 2B:
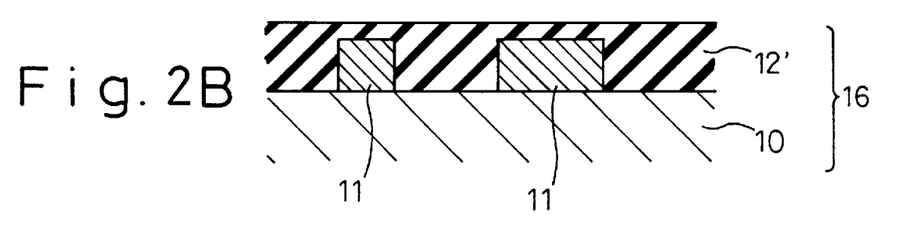
Figure 3:
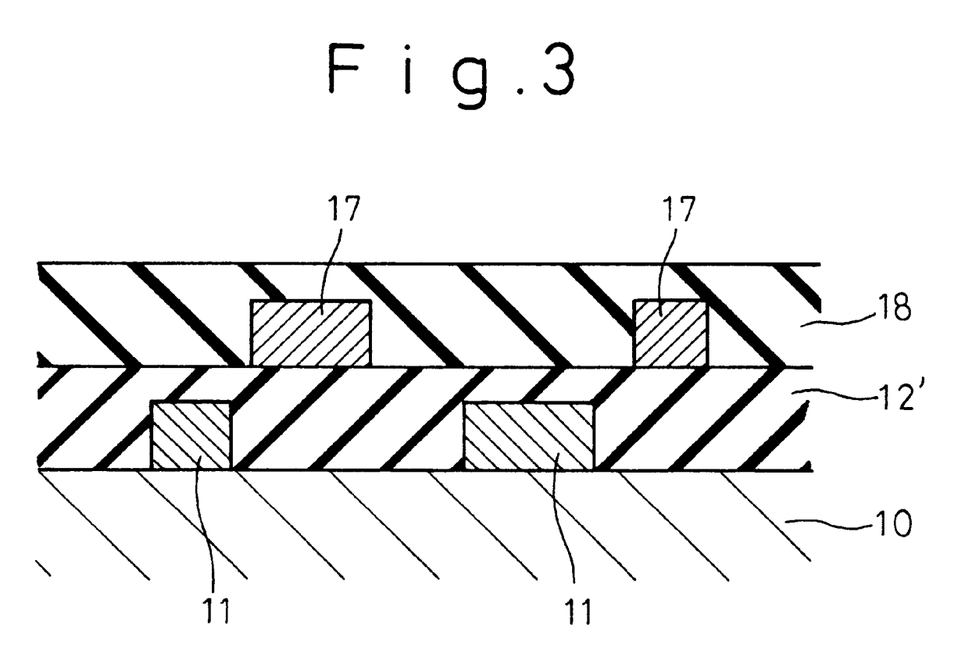
FIG. 3 schematically shows another substrate of the invention produced using an etchback process.

As shown in FIG. 2A, when an etchback process is used, a solvent solution of the planarizing material of the invention is applied onto a substrate 15 to be treated consisting of a support 10, eminences 11 such as wirings in a multilayered wiring board, and an insulating film 12 which is formed on eminences 11 in such a manner that the formed film 12 has a thickness greater than the maximum height of the eminences, by a method such as spin coating. The coated substrate is then heated to allow the solvent to be evaporated and also allow the planarizing material to be reflowed, to thereby yield a planarizing film 13, as illustrated in FIG. 2A. Subsequently, the whole surface of the substrate covered by the planarizing film 13 is etched back in a dry atmosphere so as not to leave the material of the planarizing film 13 behind, to thereby yield a planarized insulating film 12', as shown in FIG. 2B. Thus, the resulting substrate 16 of the invention comprises the support 10, the eminences 11, and the planarized insulating film 12'. According to this process, which does not involve a wet etching process using an etching solution such as an alkaline solution but employs a dry etching process, it is possible to avoid damage to wiring sensitive to an alkaline etching solution and planarize an insulating film. It should be noted that the substrate thus formed may be provided with further eminences 17 and insulating film 18, as shown in FIG. 3. In this embodiment, the further insulating film 18 may have a planarized or non-planarized surface, as required.

The insulating films as used in the above embodiment can be $SiO_2$ films, such as plasma-enhanced CVD (chemical vapor deposition) films based on silane, plasma-enhanced TEOS-CVD films based on tetraethylorthosilicate (TEOS), and ozone-treated TEOS films, SOG films formed by a spin coating process, or combinations of a CVD film and an SOG film. The etchback of the planarizing films may be carried out by a fluorine plasma; however, oxygen may be introduced to the plasma atmosphere in order to improve the ratio of the etching rate selectivities of the planarizing film and the insulating film and the etching speed.

Thus, the planarization of an underlying insulating film combined with an etchback process can be readily carried out in a known manner, using conditions depending on types of the planarizing film material and the insulating film material.

The following examples are provided to further describe the invention. It should be noted that the invention should not be limited by these examples in any way.

Figure 4:
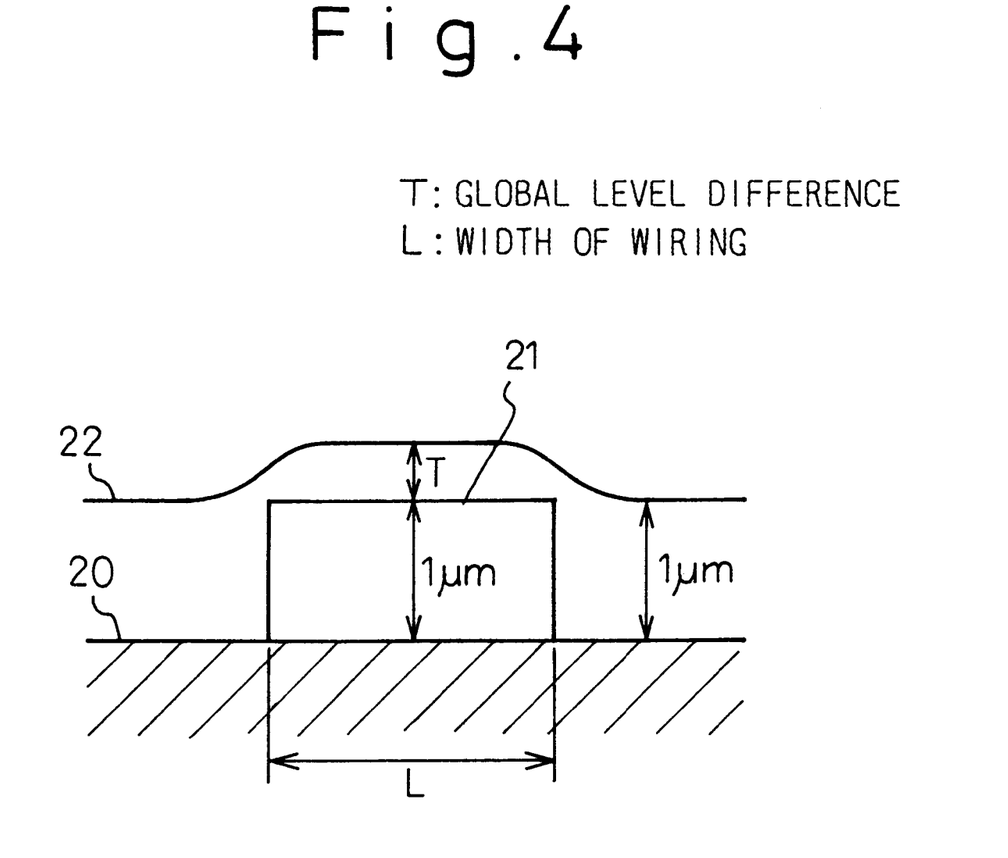
FIG. 4 illustrates the global level difference measured in the Examples.

For evaluation of planarizabilities in the following examples (FIG. 4), substrates for evaluating planarizability made of silicon were used, on which various aluminum wiring patterns were formed having sizes of from 10×10 micrometers to 8,000×8,000 micrometers. Thus, the formed wiring patterns had a width L of 10 to 8,000 micrometers. Global level differences obtained in the examples represent to the thickness T of a planarizing film 22 on an aluminum pattern 21 formed on a support of silicon 20, which was observed when the planarizing material was applied to cover the support surface and aluminum patterns thereon so as to provide the planarizing film having a thickness of 1 micrometer, which was the same as the height of the aluminum pattern 21, in the field area of the support 20 (i.e., the area of the support 20 in which the aluminum patterns were not formed), as shown in FIG. 4. The thicknesses of the planarizing films were measured by a surface roughness tester.

EXAMPLE 1

(Example of Synthesis)

52.66 grams (0.2 mole) of 1,4-bis(dimethylchlorosilyl)benzene was charged to a 1 liter flask, and was dissolved in 200 milliliters of methyl isobutyl ketone at room temperature. 3.6 grams (0.2 mole) of pure water was then dropped into the flask at room temperature, and the mixture was heated at 118° C. for one hour. This reaction solution was washed with water five times using a separating funnel, and was then concentrated by a rotary evaporator. Subsequently, the concentrated solution was dropped into a beaker containing 1 liter of acetonitrile, with agitation, and was reprecipitated, after which the precipitate was recovered by filtration and dissolved in benzene, to recover a polymer by freeze drying. An IR analysis revealed that the resultant polymer was polytetramethylsilphenylenesiloxane. A GPC using a polystyrene standard revealed that the polymer had a weight average molecular weight of about 5,000, and a polydispersion (Mw/Mn) of 1.46.

EXAMPLE 2

(Example of Synthesis)

52.66 grams (0.2 mole) of 1,4-bis(dimethylchlorosilyl) benzene was charged to a 1 liter flask, and was dissolved in 200 milliliters of methyl isobutyl ketone at room temperature. 3.6 grams (0.2 mole) of pure water was then dropped into the flask at room temperature, and the mixture was heated at 118° C. for three hours. This reaction solution was washed with water five times using a separating funnel, and was then concentrated by a rotary evaporator. Subsequently, the concentrated solution was dropped into a beaker containing 1 liter of acetonitrile, with agitation, and was reprecipitated, after which the precipitate was recovered by filtration and dissolved in benzene, to recover a polymer by freeze drying. An IR analysis revealed that the resultant polymer was polytetramethylsilphenylenesiloxane. A GPC using a polystyrene standard revealed that the polymer had a weight average molecular weight of about 10,000, and a polydispersion of 1.32.

EXAMPLE 3

(Example of Synthesis)

52.66 grams (0.2 mole) of 1,4-bis(dimethylchlorosilyl) benzene was charged to a 1 liter flask, and was dissolved in 200 milliliters of methyl isobutyl ketone at room temperature. 3.6 grams (0.2 mole) of pure water was then dropped into the flask at room temperature, and the mixture was heated at 118° C. for seven hours. This reaction solution was washed with water five times using a separating funnel, and was then concentrated by a rotary evaporator. Subsequently, the concentrated solution was dropped into a beaker containing 1 liter of acetonitrile, with agitation, and was reprecipitated, after which the precipitate was recovered by filtration and dissolved in benzene, to recover a polymer by freeze drying. An IR analysis revealed that the resultant polymer was polytetramethylsilphenylenesiloxane. A GPC using a polystyrene standard revealed that the polymer had a weight average molecular weight of about 20,000, and a polydispersion of 1.41.

EXAMPLE 4

(Example of Synthesis)

52.66 grams (0.2 mole) of 1,4-bis(dimethylchlorosilyl) benzene was charged to a 1 liter flask, and was dissolved in 200 milliliters of methyl isobutyl ketone at room temperature. 3.6 grams (0.2 mole) of pure water was then dropped into the flask at room temperature, after which 30.26 grams (0.2 mole) of divinyldichlorosilane was dropped, and the mixture was heated at 118° C. for two hours. This reaction solution was washed with water five times using a separating funnel, and was then concentrated by a rotary evaporator. Subsequently, the concentrated solution was dropped into a beaker containing 1 liter of acetonitrile, with agitation, and was reprecipitated, after which the precipitate was recovered by filtration and dissolved in benzene, to recover a polymer by freeze drying. An IR analysis revealed that the resultant polymer was polytetramethylsilphenylenesiloxane/ divinylsiloxane copolymer (copolymerization ratio 1:1). A GPC using a polystyrene standard revealed that the polymer had a weight average molecular weight of about 5,000, and a polydispersion of 1.33.

EXAMPLE 5

(Example of Synthesis)

52.66 grams (0.2 mole) of 1,4-bis(dimethylchlorosilyl) benzene was charged to a 1 liter flask, and was dissolved in 200 milliliters of methyl isobutyl ketone at room temperature. 3.6 grams (0.2 mole) of pure water was then dropped into the flask at room temperature, after which 30.26 grams (0.2 mole) of divinyldichlorosilane was dropped, and the mixture was heated at 118° C. for six hours. This reaction solution was washed with water five times using a separating funnel, and was then concentrated by a rotary evaporator. Subsequently, the concentrated solution was dropped into a beaker containing 1 liter of acetonitrile, with agitation, and was reprecipitated, after which the precipitate was recovered by filtration and dissolved in benzene, to recover a polymer by freeze drying. An IR analysis revealed that the resultant polymer was polytetramethylsilphenylenesiloxane/ divinylsiloxane copolymer (copolymerization ratio 1:1). A GPC using a polystyrene standard revealed that the polymer had a weight average molecular weight of about 10,000, and a polydispersion of 1.36.

EXAMPLE 6

(Example of Synthesis)

52.66 grams (0.2 mole) of 1,4-bis(dimethylchlorosilyl) benzene was charged to a 1 liter flask, and was dissolved in 200 milliliters of methyl isobutyl ketone at room temperature. 3.6 grams (0.2 mole) of pure water was then dropped into the flask at room temperature, after which 30.26 grams (0.2 mole) of divinyldichlorosilane was dropped, and the mixture was heated at 118° C. for ten hours. This reaction solution was washed with water five times using a separating funnel, and was then concentrated by a rotary evaporator. Subsequently, the concentrated solution was dropped into a beaker containing 1 liter of acetonitrile, with agitation, and was reprecipitated, after which the precipitate was recovered by filtration and dissolved in benzene, to recover a polymer by freeze drying. An IR analysis revealed that the resultant polymer was polytetramethylsilphenylenesiloxane/ divinylsiloxane copolymer (copolymerization ratio 1:1). A GPC using a polystyrene standard revealed that the polymer had a weight average molecular weight of about 20,000, and a polydispersion of 1.36.

EXAMPLE 7

Figure 5:
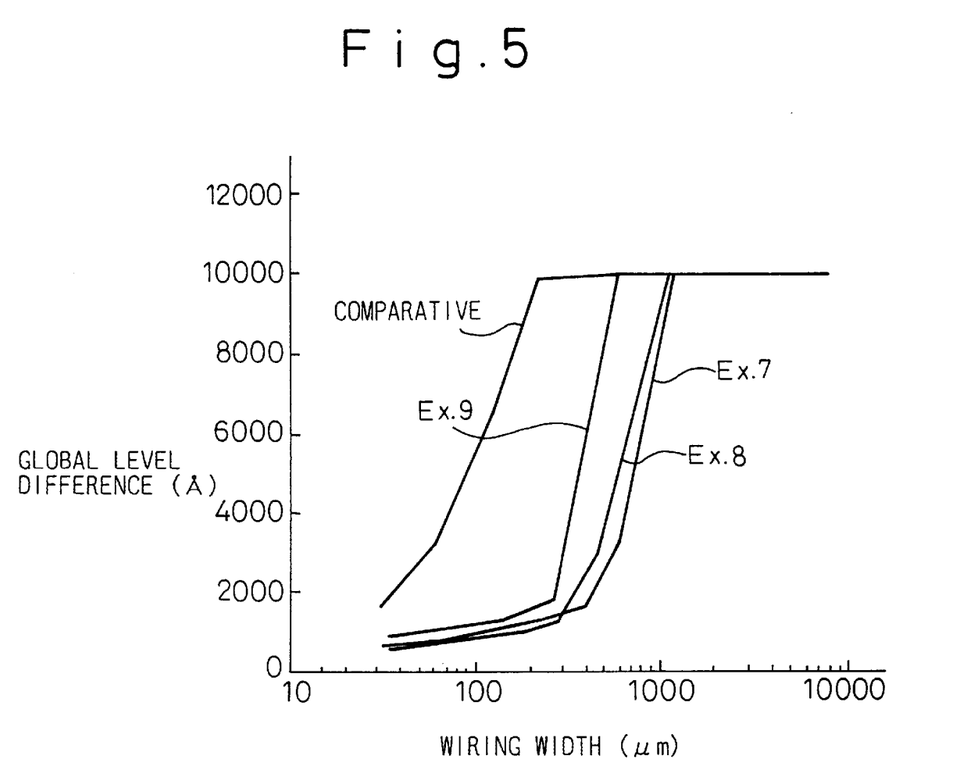
FIG. 5 diagrammatically shows the global level differences obtained in Examples 7 to 9.

A 30% by weight solution in xylene of the polytetramethylsilphenylenesiloxane which was prepared in Example 1, and had a weight average molecular weight of about 5,000 and a polydispersion of 1.46, was applied onto a planarizability evaluating substrate by spin coating. The substrate was then subjected to a heat treatment at 250° C. for 3 minutes to allow the polymer to be reflowed, and was successively irradiated with ultraviolet (UV) radiation from a UV lamp at 250° C. for ten minutes, to thereby crosslink the polymer. The global level difference for the planarizing film thus obtained is shown in FIG. 5.

EXAMPLE 8

A 30% by weight solution in xylene of the polytetramethylsilphenyenesiloxane which was prepared in Example 2, and had a weight average molecular weight of about 10,000 and a polydispersion of 1.32, was applied onto a planarizability evaluating substrate by spin coating. The substrate was then subjected to a heat treatment at 250° C. for 3 minutes to allow the polymer to be reflowed, and was successively irradiated with UV radiation from a UV lamp at 250° C. for ten minutes, to thereby crosslink the polymer. The global level difference for the planarizing film thus obtained is shown in FIG. 5.

EXAMPLE 9

A 30% by weight solution in xylene of the polytetramethylsilphenylenesiloxane which was prepared in Example 3, and had a weight average molecular weight of about 20,000 and a polydispersion of 1.41, was applied onto a planarizability evaluating substrate by spin coating. The substrate was then subjected to a heat treatment at 250° C. for 3 minutes to allow the polymer to be reflowed, and was successively irradiated with UV radiation from a UV lamp at 250° C. for ten minutes, to thereby crosslink the polymer. The global level difference for the planarizing film thus obtained is shown in FIG. 5.

EXAMPLE 10

Figure 6:
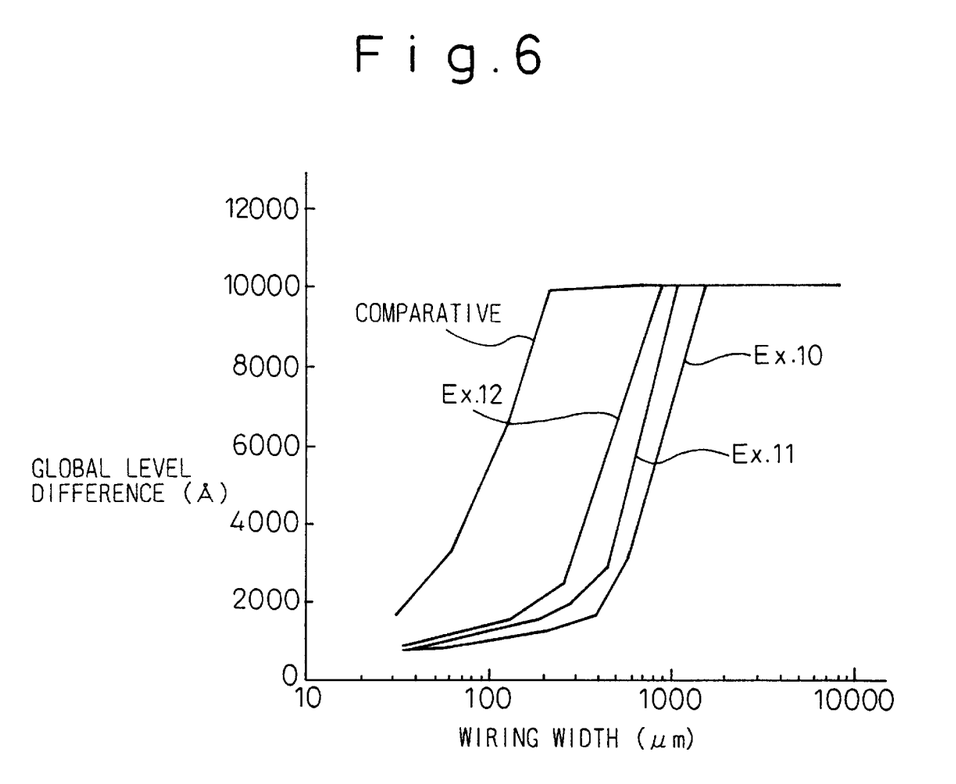
FIG. 6 diagrammatically shows the global level differences obtained in Examples 10 to 12.

A 30% by weight solution in xylene of the polytetramethylsilphenyenesiloxane/divinylsiloxane copolymer which was prepared in Example 4, and had a weight average molecular weight of about 5,000 and a polydispersion of 1.33, was applied onto a planarizability evaluating substrate by spin coating. The substrate was then subjected to a heat treatment at 250° C. for 3 minutes to allow the polymer to be reflowed and crosslinked. The global level difference for the planarizing film thus obtained is shown in FIG. 6.

EXAMPLE 11

A 30% by weight solution in xylene of the polytetramethylsilphenyenesiloxane/divinylsiloxane copolymer which was prepared in Example 5, and had a weight average molecular weight of about 10,000 and a polydispersion of 1.36, was applied onto a planarizability evaluating substrate by spin coating. The substrate was then subjected to a heat treatment at 250° C. for 3 minutes to allow the polymer to be reflowed and crosslinked. The global level difference for the planarizing film thus obtained is shown in FIG. 6.

EXAMPLE 12

A 30% by weight solution in xylene of the polytetramethylsilphenylenesiloxane/divinylsiloxane copolymer which was prepared in Example 6, and had a weight average molecular weight of about 20,000 and a polydispersion of 1.36, was applied onto a planarizability evaluating substrate by spin coating. The substrate was then subjected to a heat treatment at 250° C. for 3 minutes to allow the polymer to be reflowed and crosslinked. The global level difference for the planarizing film thus obtained is shown in FIG. 6.

COMPARATIVE EXAMPLE

A planarizing material manufactured by Allied Signal, AccFlow, the excellent reflowability of which is appreciated, was applied onto a planarizability evaluating substrate by spin coating, and the substrate was then subjected to a heat treatment at 250° C. for three minutes. The global level difference for the planarizing film thus obtained is shown in both FIGS. 5 and 6.

As seen from FIGS. 5 and 6, using the planarizing material of the invention, level differences on wirings having a width reaching several hundred micrometers can be easily planarized, the width being distinctly broader compared with the width capable being planarized using the prior planarizing material.

EXAMPLE 13

Figure 7:
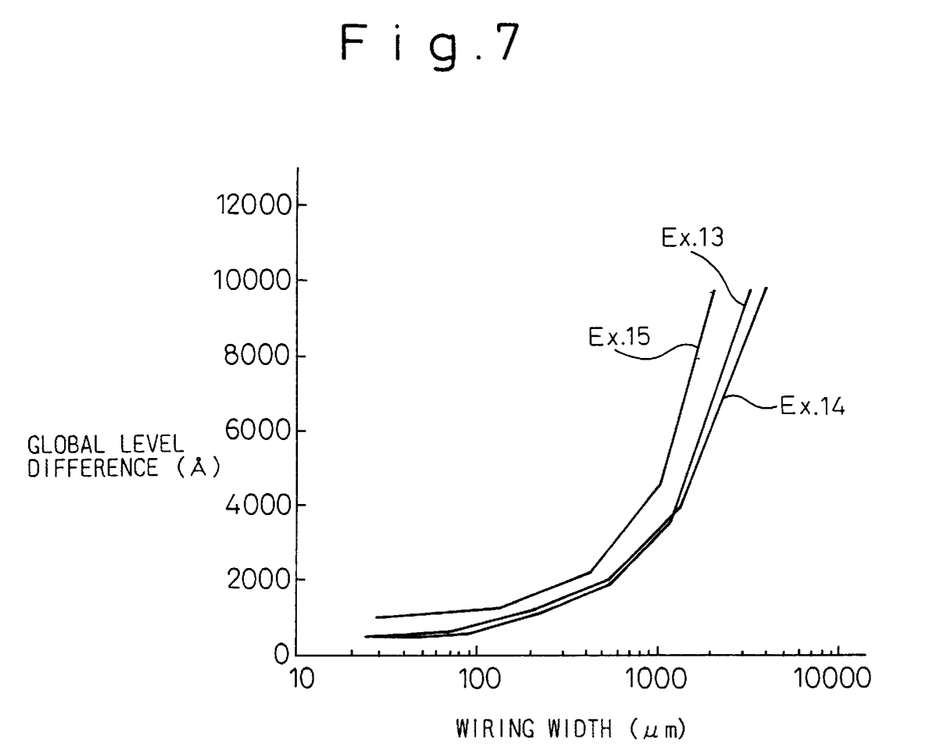
FIG. 7 diagrammatically shows the global level differences obtained in Examples 13 to 15.

An SOG insulating film of 1 micrometer thickness was formed on a planarizability evaluating substrate by spin coating, using an organic SOG (OCD Type-7, manufactured by Tokyo Oka). This insulating film was coated with a 30% by weight solution in xylene of the polytetramethylsilphenylenesiloxane obtained in Example 1. The substrate was then subjected to a heat treatment at 250° C. for 3 minutes to allow the polymer to be reflowed, and was successively irradiated with UV radiation from a UV lamp at 250° C. for ten minutes, to thereby crosslink the polymer. The global level difference for the planarizing film thus obtained is shown in FIG. 7.

EXAMPLE 14

An SOG insulating film of 1 micrometer thickness was formed on a planarizability evaluating substrate by spin coating, using an organic SOG (OCD Type-7, manufactured by Tokyo Oka). This insulating film was coated with a 30% by weight solution in xylene of the polytetramethylsilphenylenesiloxane obtained in Example 2. The substrate was then subjected to a heat treatment at 250° C. for 3 minutes to allow the polymer to be reflowed, and was successively irradiated with UV radiation from a UV lamp at 250° C. for ten minutes, to thereby crosslink the polymer. The global level difference for the planarizing film thus obtained is shown in FIG. 7.

EXAMPLE 15

An SOG insulating film of 1 micrometer thickness was formed on a planarizability evaluating substrate by spin coating, using an organic SOG (OCD Type-7, manufactured by Tokyo Oka). This insulating film was coated with a 30% by weight solution in xylene of the polytetramethylsilphenylenesiloxane obtained in Example 3. The substrate was then subjected to a heat treatment at 250° C. for 3 minutes to allow the polymer to be reflowed, and was successively irradiated with UV radiation from a UV lamp at 250° C. for ten minutes, to thereby crosslink the polymer. The global level difference for the planarizing film thus obtained is shown in FIG. 7.

EXAMPLE 16

Figure 8:
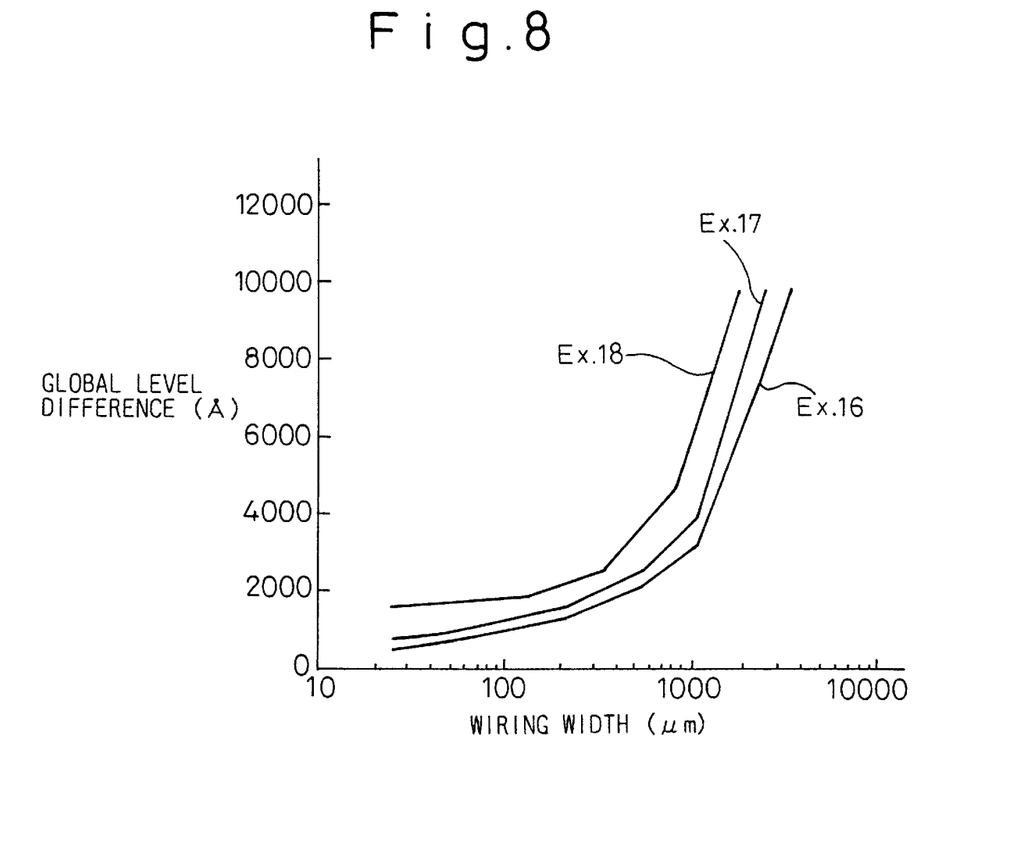
FIG. 8 diagrammatically shows the global level differences obtained in Examples 16 to 18.

An SOG insulating film of 1 micrometer thickness was formed on a planarizability evaluating substrate by spin coating, using an organic SOG (OCD Type-7, manufactured by Tokyo Oka). This insulating film was coated with a 30% by weight solution in xylene of the polytetramethylsilphenylenesiloxane/divinylsiloxane copolymer obtained in Example 4. The substrate was then subjected to a heat treatment at 250° C. for 3 minutes to allow the polymer to be reflowed and crosslinked. The global level difference for the planarizing film thus obtained is shown in FIG. 8.

EXAMPLE 17

An SOG insulating film of 1 micrometer thickness was formed on a planarizability evaluating substrate by spin coating, using an organic SOG (OCD Type-7, manufactured by Tokyo Oka). This insulating film was coated with a 30% by weight solution in xylene of the polytetramethylsilphenylenesiloxane/divinylsiloxane copolymer obtained in Example 5. The substrate was then subjected to a heat treatment at 250° C. for 3 minutes to allow the polymer to be reflowed and crosslinked. The global level difference for the planarizing film thus obtained is shown in FIG. 8.

EXAMPLE 18

An SOG insulating film of 1 micrometer thickness was formed on a planarizability evaluating substrate by spin coating, using an organic SOG (OCD Type-7, manufactured by Tokyo Oka). This insulating film was coated with a 30% by weight solution in xylene of the polytetramethylsilphenylenesiloxane/divinylsiloxane copolymer obtained in Example 6. The substrate was then subjected to a heat treatment at 250° C. for 3 minutes to allow the polymer to be reflowed and crosslinked. The global level difference for the planarizing film thus obtained is shown in FIG. 8.

In FIGS. 7 and 8, it is shown that even in the case where planarizing films are formed on an SOG insulating film according to the invention, level differences on wirings having a width reaching several hundred micrometers can be easily planarized. Thus, according to the invention, a film of good planarizability can be easily formed even on an insulating film having eminences of broad width. When such a film of good planarizability is etched back, the underlying insulating film can be easily planarized.

As described hereinbefore, the invention allows wiring patterns having a width reaching several hundred micrometers (e.g., 500 to 600 micrometers or more), and typically a width of 10 to 500 micrometers, to be planarized. Accordingly, the invention makes it possible to form a minute wiring pattern in the production of multi-layered wiring structure because of an extended focus margin of a resist, and can provide multi-layered wiring boards as well as semiconductor devices of high reliability.

Further, according to the invention, since planarization can take place without using an etching solution such as an alkaline solution, damage to the wiring can be prevented, and throughput can be improved.

We claim:

1. A material provided on an uneven or up-and-down surface of a substrate for planarizing said surface, the material consisting essentially of a polymer represented by the general formula:

wherein each of the substituents $R^1$ to $R^4$ is an alkyl group having 1 to 3 carbon atoms, an alkylene group having 2 or 3 carbon atoms, or a phenyl group, the substituents $R^1$ to $R^4$ being capable of denoting the same or different groups, and n is a positive integer, the polymer having a weight average molecular weight of 500 to 50,000, and the polymer exhibiting a sufficient reflowability to be planarized when coated on the uneven surface of said substrate and heated.

2. The material of claim 1, which exhibits a sufficient reflowability to be planarized when coated on a substrate surface on which eminences having a width of 10 to 500 micrometers are present.

3. The material of claim 1, which has a weight average molecular weight of 1,000 to 20,000.

4. The material of claim 1, wherein the material is selected from the group consisting of polytetramethylsilphenylenesiloxanes, polytetraethylsilphenylenesiloxanes, and polytetravinylsilphenylenesiloxanes.

5. The material of claim 1, which further comprises a solvent.

6. The material of claim 5, wherein the solvent is selected from the group consisting of xylene, methyl isobutyl ketone, and toluene.

7. The material of claim 1, wherein the substrate is selected from a multi-layered wiring board or a semiconductor device having a multi-layer structure.

8. A material provided on an uneven or up-and-down surface of a substrate for planarizing said surface, the material consisting essentially of a polymer represented by the general formula:

wherein each of the substituents $R^1$ to $R^4$ is an alkyl group having 1 to 3 carbon atoms, an alkylene group having 2 or 3 carbon atoms, or a phenyl group, the substituents $R^1$ to $R^4$ being capable of denoting the same or different groups, each of the substituents $R^5$ and $R^6$ is an allyl group having 1 to 3 carbon atoms, an alkylene group having 2 or 3 carbon atoms, or phenyl group, the substituents $R^5$ and $R^6$ being capable of denoting the same or different groups, m and n are positive integers, and the ratio of m to n is less than 2, the polymer having a weight average molecular weight of 500 to 50,000, and the polymer exhibiting a sufficient reflowability to be planarized when coated on the uneven surface of said substrate and heated.

9. The material of claim 8, which exhibits a sufficient reflowability to be planarized when coated on a substrate surface on which eminences having a width of 10 to 500 micrometers are present.

10. The material of claim 8, which has a weight average molecular weight of 1,000 to 20,000.

11. The material of claim 8, wherein the material is selected from the group consisting of polytetramethylsilphenylenesiloxane/divinylsiloxane copolymers, polytetramethylsilphenylenesiloxane/dimethylsiloxane copolymers, and polytetramethylsilphenylenesiloxane/diallylsiloxane copolymers.

12. The material of claim 8, which further comprises a solvent.

13. The material of claim 12, wherein the solvent is selected from the group consisting of xylene, methyl isobutyl ketone, and toluene.

14. The material of claim 8, wherein the substrate is selected from a multi-layered wiring board or a semiconductor device having a multi-layer structure.

* * * * *